(12) United States Patent
Watanabe

(10) Patent No.: US 6,229,734 B1
(45) Date of Patent: May 8, 2001

(54) NONVOLATILE SEMICONDUCTOR STORAGE DEVICE HAVING CONTROLLED CELL THRESHOLD VOLTAGE DISTRIBUTION

(75) Inventor: Kazuo Watanabe, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/531,548

(22) Filed: Mar. 20, 2000

(30) Foreign Application Priority Data

Mar. 23, 1999 (JP) .................................................. 11-078411

(51) Int. Cl.[7] ............................ G11C 16/06; G11C 16/04

(52) U.S. Cl. ............................... 365/185.22; 365/185.18; 365/185.24

(58) Field of Search ......................... 365/185.18, 185.21, 365/185.22, 185.24

(56) References Cited

U.S. PATENT DOCUMENTS

| | | | |
|---|---|---|---|
| 5,297,096 | * 3/1994 | Terada et al. | 365/185.11 |
| 5,406,521 | * 4/1995 | Hara | 365/185.12 |
| 5,646,891 | * 7/1997 | Okamoto | 365/185.22 |
| 5,732,019 | * 3/1998 | Urai | 365/185.24 |

FOREIGN PATENT DOCUMENTS 7-192482   7/1995   (JP) .

* cited by examiner

*Primary Examiner*—Son Mai
(74) *Attorney, Agent, or Firm*—Darryl G. Walker

(57) ABSTRACT

A nonvolatile semiconductor storage device is disclosed that can have memory cells with a narrower erase threshold voltage distribution, a low power supply voltage, and high access speeds. According to one embodiment, a nonvolatile semiconductor device (100) may include a detect mode that can determine if a selected memory cell (102-01 to 102-32) has an erase threshold voltage below a predetermined value. In a detect mode, a cell check signal CELLCHK is active, resulting in a cell check voltage generator circuit (128) generating a detect bias voltage. According to power switch control signals PSCTRL, a power source switch 124 connects the sources and well(s) of the memory cells (102-01 to 102-32) to the cell check voltage generator circuit (128). Word lines (104-0 to 104-n) of deselected memory cells are driven to a low power supply voltage. The word line deselect bias voltage and detect bias voltage can prevent low erase threshold voltage memory cells from generating leakage current on a bit line. In this way, it can be determined if a selected memory cell (102-01 to 102-32) has a low erase threshold voltage or not. The threshold voltage of low erase threshold voltage memory cells may then be raised with a write operation, which can create narrower erase threshold voltage distributions.

20 Claims, 4 Drawing Sheets

US 6,229,734 B1

NONVOLATILE SEMICONDUCTOR STORAGE DEVICE HAVING CONTROLLED CELL THRESHOLD VOLTAGE DISTRIBUTION

TECHNICAL FIELD

The present invention relates generally to nonvolatile semiconductor storage devices and more particularly to nonvolatile semiconductor storage devices having memory cells with alterable threshold voltages.

BACKGROUND OF THE INVENTION

Nonvolatile semiconductor storage devices can advantageously retain data values in the absence of power. This makes such devices highly desirable in portable electronic devices. Many types of nonvolatile semiconductor storage devices include memory cells having alterable threshold voltages. Such cells may be programmed to one particular threshold voltage, and erased to another. Among the types of storage devices that may include such cells are electrically erasable programmable read only memories (EEPROMs), including "flash" EEPROMs. Flash EEPROMs can include sectors having memory cells that can be simultaneously erased.

While nonvolatile semiconductor storage devices are desirable in portable devices, at the same time, the power supply levels of electronic devices continues to fall. While many types of integrated circuits can accommodate such lower power supply levels, such lower power supply levels can be more difficult to implement in nonvolatile devices.

To better understand the difficulties of reduced power supply levels in nonvolatile semiconductor storage devices, a conventional nonvolatile semiconductor storage device will be described.

FIG. 5 is a circuit diagram showing a conventional nonvolatile semiconductor storage device. The nonvolatile semiconductor storage device is designated by the general reference character 500 and is shown to include an array of memory cells, shown as M01 to M32. Each memory cell (M01 to M32) can be connected to a corresponding bit line (BL0 to BLn) and word line (W0 to Wn). Further, each memory cell (M01 to M32) may include a control gate, a floating gate, and a substrate (with diffusion regions).

A read operation from memory cell M01 will now be described. In a read operation, an applied address can result in row decoder 502 driving word line W0 to a select potential while the remaining word lines, including Wn, are driven to a deselect potential. In addition, an address can result in a column decoder 504 activating a column select signal Y0 while the remaining column select signals (Y1 to Yn) are deactivated. Consequently, transfer gate Tr0 can be enabled, connecting bit line BL0 to sense amplifier input node DIG. A bit bias circuit 506 can bias input node DIG to a high potential. In a read operation, a power source switch 508 can connect sources and wells of the memory cells (M01 to M32) to a ground potential (GND).

A read operation can also activate a reference select signal Yref and a reference word line signal Wref. In addition, a reference bit bias circuit 510 can bias a reference node DIGREF. This can result in a reference current Ir flowing through a reference memory cell MR.

If memory cell M01 is programmed, its threshold voltage should be high enough that despite the select potential on word line W0, memory cell M01 will remain essentially turned off. Thus, any current drawn by the cell (shown as Im) will be smaller in magnitude than the reference current Ir. This difference, Im<Ir, can be detected by a sense amplifier 512 as one logic value. If memory cell M01 is erased, its threshold voltage should be sufficiently low enough that the select potential on word line W0 will turn memory cell M01 on. The current drawn by the cell (Im) will be greater in magnitude than the reference current Ir. This difference, Im>Ir, can be detected by a sense amplifier 512 as another logic value.

The above-described operation assumes that the memory cells (M01 to M32) operate in an ideal fashion. However, in actual applications, the threshold voltages of erased memory cells may fall within a distribution. Further, memory cells at the lower end of the distribution can introduce a leakage current. That is, even when de-selected, such low voltage threshold memory cells may draw current on a biased bit line.

The problem of a low threshold voltage memory cells will now be described with reference to FIG. 5. It will be assumed that memory cell M01 is programmed while memory cell M02 is erased, but has a low threshold voltage. In such a case, when memory cell M01 is read, despite the fact that memory cell M02 is deselected, memory cell M02 will draw a leakage current. This leakage current by itself, or when combined with leakage current from other memory cells on bit line BL0, can result in Im being greater than Ir. Thus, sense amplifier 512 will erroneously read memory cell M01 as an erased cell when it is in fact a programmed cell.

A low threshold voltage may vary according to processes and operating voltages. One example of a low threshold voltage is one volt.

As noted above, in most erase procedures, "flash" erase for example, erase threshold voltages can fall within a distribution. One such distribution is shown in FIG. 3A. In FIG. 3A, the threshold voltages of erased cells essentially fall between a high erase threshold voltage of 2.5V and a low erase threshold voltage of 1V. That is, the erased cells have a threshold voltage range of about 1.5V. It can be very difficult, if not impossible, to avoid such distributions without adding additional time and/or cost and/or circuitry to an erase process. In some contexts, low threshold voltage memory cells are referred to as "overerased" memory cells.

The distribution of FIG. 3A may provide adequate functionality for nonvolatile semiconductor devices operating at a sufficiently high power supply voltage. In particular, provided a power supply potential is 2.5V or higher, the normal distribution of threshold voltages will not result in a significant number of low threshold voltage memory cells (e.g., cells having a threshold voltage of 1V or less). With a distribution such as that shown in FIG. 3A, a word line voltage of 2.5V can be used, as it will turn on an erased memory cell (as the erased cell threshold voltage distribution is below 2.5V), and not turn on a programmed memory cell (which is assumed to have a programmed threshold voltage greater than 2.5V).

A distribution such as that set forth in FIG. 3A can be problematic for lower power supply levels. For example, if a lower power supply level of 2V is used, the maximum word line voltage is 2V. Such a word line voltage may not generate sufficient current from an erased cell. In addition, or alternatively, data sensing may take much longer than desired.

One approach for maintaining sufficient sensing current could be to lower the maximum erase threshold voltage of a memory cell distribution. Such an approach is shown in FIG. 3B. In FIG. 3B, the threshold voltages of erased cells have a high erase threshold voltage of 2V. However, because the erase threshold voltages retain the same distribution, the low erase threshold voltage is now 0.5 volts. It will be recalled, in this particular example, a low erase threshold voltage would be 1V or less. Thus, a distribution such as that of FIG. 3B can result in a large number of low threshold voltage memory cells. This can cause erroneous reading due to leakage current as described above.

The low threshold voltage of a memory cell may be adjusted by writing data to the memory cell. One of the many approaches includes a "soft" program operation, or the like. For example, if the location of a memory cell having a threshold voltage of less than 1V was known, the memory cell threshold voltage could be raised to 1V or higher by some sort of write operation.

Unfortunately, it is not possible to locate the position of a low threshold voltage memory cell with a conventional memory device arrangement. In particular, while it may be possible to know when a bit line draws too much leakage current, it is not possible to know which of the numerous deselected erased memory cells connected to the bit line is contributing to the leakage current.

One approach to narrowing the erase threshold voltage distribution of memory cells is described in Japanese Patent Laid-Open No. 7-192482. However, the described approach does not control the potential of the substrate, and thus may not provide as accurate a distribution as desired.

It would be desirable to arrive at some way of providing a nonvolatile semiconductor device that overcomes the drawbacks described above. In addition or alternatively, it would be desirable to arrive at some way of narrowing the erase threshold voltage of a memory cells in a nonvolatile semiconductor storage device. Such an approach could be particularly desirable if the nonvolatile memory device could maintain a relatively fast sense speed. It would also be desirable if such an approach could operate at a lower power supply voltage.

SUMMARY OF THE INVENTION

According to one embodiment, a nonvolatile semiconductor storage device may include a number of memory cells, each of which includes a control gate, a source, a drain and is formed in a well. The memory cells can be arranged in a matrix-like fashion, with a number of word lines connected to the control gates of the memory cells, a number of bit lines connected to the drains of the memory cells, a source line connected to the sources of the memory cells, and a well line connected the well(s) of the memory cells. In addition, a reference cell can be provided for generating a reference current. A sense amplifier may compare a reference current with current drawn by a selected memory cell.

The memory cells can be erased, with the resulting erase threshold voltages forming a distribution. Memory cells having undesirably low erase threshold voltages may be detected by biasing the source line and well line to a predetermined potential. Such a biasing arrangement can reduce and/or eliminate any leakage from deselected memory cells, allowing the threshold voltage of a selected memory cell to be determined.

According to one aspect of the embodiments, the nonvolatile semiconductor storage device may include an erase voltage generator circuit, a cell check voltage generator circuit, and a switch circuit. In an erase operation, the switch circuit may provide an erase potential from the erase voltage generator circuit to the source line. In a detect operation, for detecting memory cells having low erase threshold voltages, the switch circuit may provide a detect bias potential to the source line and well line.

According to another aspect of the embodiments, the nonvolatile semiconductor storage device may include a bit bias circuit. In a read operation, a bit bias circuit can provide a bit bias voltage to a selected bit line that enables current to be drawn by a selected memory cell if it is erased. In a detect operation, the bit line bias circuit can provide a bit bias voltage that is greater than that provided in the read operation.

According to another aspect of the embodiments, the nonvolatile semiconductor storage device may include a bit bias circuit and a reference bias circuit. In a read operation, a bit bias circuit can provide a bit bias voltage to a selected bit line that enables current to be drawn by a selected memory cell that is erased. A reference bias circuit can provide a reference bias voltage that enables current to be drawn by a reference cell. In a detect operation, the bit line bias voltage can be the same as that of the read operation, however, the reference bias voltage can be less than that of the read operation.

According to another aspect of the embodiments, a method of erasing a nonvolatile semiconductor device can include providing a number of memory cells, formed in one or more wells, that each include a control gate, a floating gate, a source, and a drain. Word lines and bit lines can be provided that are connected to the control gates and drains, respectively, of the memory cells. A source line can be provided that is connected to the memory cell sources and a well line can be provided that is connected to the well(s) of the memory cells. A sense amplifier can be provided the compares a bit line current with a reference current provided by a reference cell.

The method may further include the following steps. First, the memory cells may be erased. Second, a bias voltage may be applied to the sources and wells of the memory cells that can allow low erase threshold voltage memory cells to be detected. Detecting such low erase threshold voltage memory cells can result in a more controllable erase threshold voltage distribution.

According to another aspect of the embodiments, the above method may further include a third step of biasing the bit line of a selected memory cell in a detect operation to a potential higher than that of a normal read operation.

DETAILED DESCRIPTION OF THE EMBODIMENTS

A nonvolatile semiconductor memory device according to one embodiment of the present invention may include a number of memory cells arranged in a matrix. Each memory cell can include a control gate, a floating gate, a source and a drain. A number of word lines can be connected to the memory cell control gates. A number of bit lines can be connected to the drains of the memory cells. The bit lines can be perpendicular to the word lines. In addition, a source line may be connected to the sources of the memory cells. Memory cells may also have a well "line" that can represent a connection to one or more wells in which the memory cells are formed.

The present invention may also include a reference cell that provides a reference current with respect to programmed and erased memory cells. In addition, a sense amplifier is included that can compare current from a selected bit line with the reference current.

In an arrangement as described above, an erase threshold voltage distribution can be narrowed by enabling the detection of low threshold voltage memory cells. Detecting low threshold voltage memory cells may include biasing a source line and a well line so that deselected memory cells, even those having low threshold voltages, contribute little or no current to their corresponding bit lines.

More particular embodiments will now be described with reference to a number of diagrams.

Figure 1:
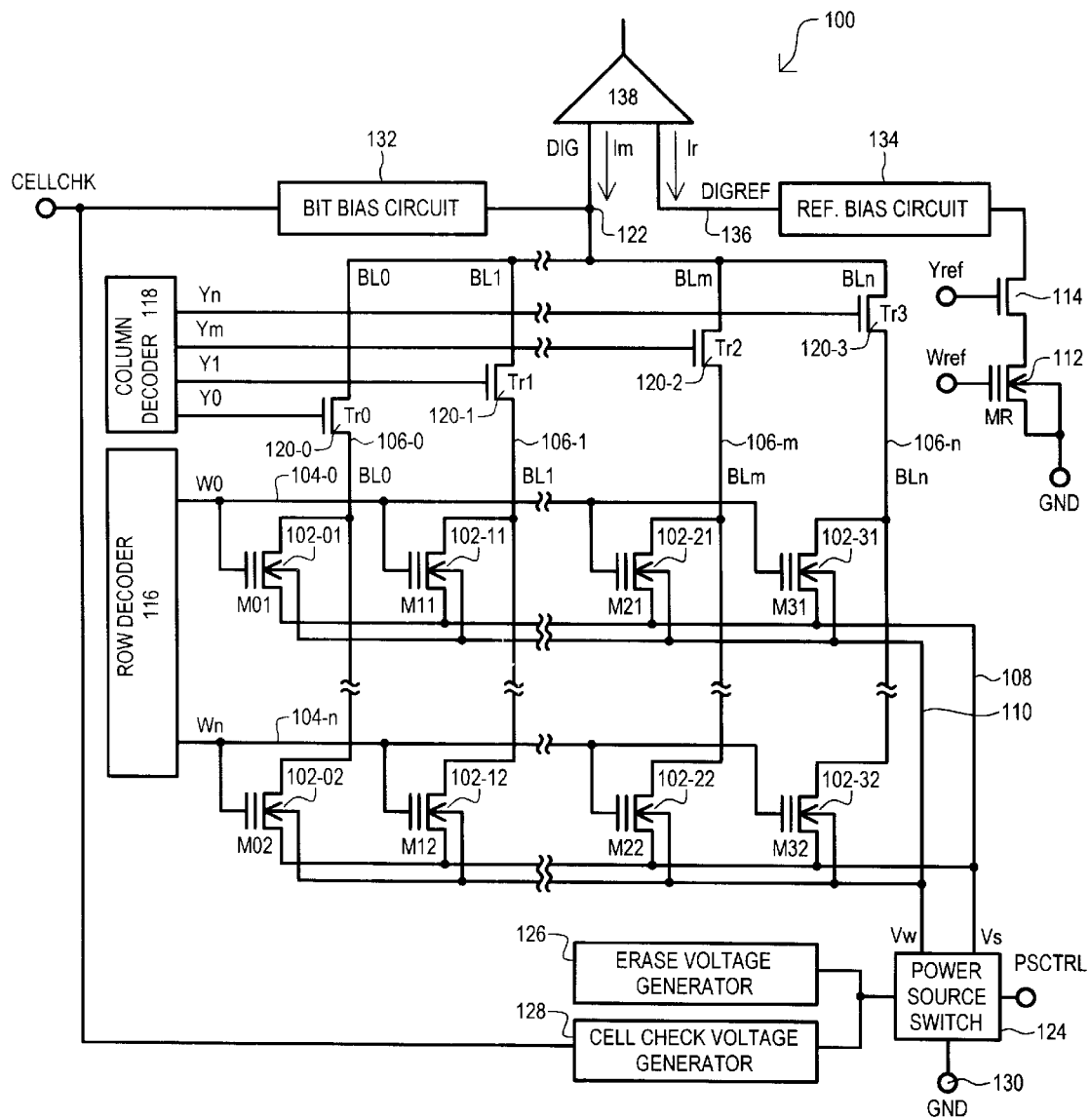
FIG. 1 is a circuit diagram of a first particular embodiment.

FIG. 1 shows a circuit diagram of a nonvolatile semiconductor storage device according to one embodiment. The nonvolatile semiconductor storage device is designated by the general reference character 100 and is shown to include a number of memory cells 102-01 to 102-32 arranged in a matrix-like fashion. In one a particular arrangement, each memory cell (102-01 to 102-32) can include a control gate, a floating gate, a source, and a drain. The memory cells (102-01 to 102-32) may also be formed in one or more wells.

A number of word lines 104-0 to 104-n can be connected to the control gates of the memory cells (102-01 to 102-32). A number of bit lines 106-0 to 106-n can be connected to the drains of the memory cells (102-01 to 102-32). Bit lines (106-0 to 106-n) may be perpendicular to word lines (104-0 to 104-n).

A source line 108 may be connected to the sources of memory cells (102-01 to 102-32). In addition, a well line 110 may be connected to the well(s) of memory cells (102-01 to 102-32).

A nonvolatile semiconductor storage device 100 may also include a reference cell 112 and reference transfer gate 114. A reference cell 112 may provide a reference current Ir. A reference current Ir may be compared with a memory cell current Im drawn by a selected memory cell (102-01 to 102-32).

A memory cell (102-01 to 102-32) may be selected by a row decoder 116 and a column decoder 118. A row decoder 116 may activate a selected word line (104-0 to 104-n), while a column decoder 118 may activate a column select signal Y0–Yn. Column select signals (Y0–Yn) can control corresponding transfer gates 120-0 to 120-3. Each transfer gate (120-0 to 120-3) can connect a corresponding bit line (106-0 to 106-n) to a sense amplifier input 122 DIG.

In some operations, at the same time a memory cell (102-01 to 102-32) is selected, the reference cell 112 may be selected. A reference select signal Yref can activate reference transfer gate 114 and the reference cell 112 may be selected by a reference word line signal Wref. The selected reference cell 112 can generate a reference current Ir.

In the embodiment of FIG. 1, source line 108 and well line 110 can be connected to a power source switch 124. A power source switch 124 can connect a source line 108 and/or a well line 110 to various potentials according to one or more power switch control signals PSCTRL. In FIG. 1, the source line 108 and well line 110 can be connected to an erase voltage generator circuit 126, a cell check voltage generator circuit 128, or a low power supply voltage 130 (ground "GND").

A bit bias circuit 132 can bias sense node 122 to a bit bias potential. A bit bias potential can enable a selected memory cell (102-01 to 102-32) to draw current in the event it is erased, including erased to a low threshold voltage. A reference bias circuit 134 can bias a sense reference node 136 (DIGREF) to a reference bias potential. A reference bias potential enables a reference cell 112 to draw a reference current Ir when selected.

A nonvolatile semiconductor storage device 100 may also include a cell check signal CELLCHK. A cell check signal CELLCHK can alter the operation of the bit bias circuit 132 and enable the cell check voltage generator circuit 128.

A sense amplifier 138 may be included that compares a cell current Im (which can essentially be 0 $\mu$m in some cases) with the reference current Ir. In the embodiment of FIG. 1, in a read operation, such a comparison may indicate if a selected memory cell is erased or programmed. In addition, in a detect operation, such a comparison may indicate if a selected memory cell has a low erase threshold voltage or not.

Having described the general constituents of the embodiment of FIG. 1, the operation of FIG. 1 will now be described.

First, a "normal" read operation for the embodiment of FIG. 1 will be described. A normal read operation, ideally, determines if a selected memory cell is programmed or erased. In the arrangement of FIG. 1, in a normal read operation the cell check signal CELLCHK is inactive. Consequently, cell check voltage generating circuit 128 is inactive.

In a read operation, power switch control signals PSCTRL can result in power source switch 124 connecting source line 108 and well line 110 to a lower power supply GND. The low power supply GND may be 0V, as but one example. Consequently, the sources and wells of memory cells (102-01 to 102-32) can be connected to the lower power supply GND.

According to applied signals, such as address signals for example, a memory cell (102-01 to 102-32) can be selected for a read operation. For example, if memory cell 102-01 is selected, row decoder 116 can activate word line signal W0 on word line word line 104-0. the remaining word lines signals W1 to Wn can be inactive. In addition, column decoder 118 can activate column select signal Y0, enabling transfer gate 120-0. The remaining column select signals Y1 to Yn can be inactive and the remaining transfer gates 120-1 to 120-3 can be disabled. In such a configuration, bit line 106-0 can be connected to sense amplifier input 122 while the remaining bit lines 106-1 to 106-n can be isolated from sense amplifier input 122.

A read operation can also activate the reference select signal Yref and the reference word line Wref. This can connect the drain of reference cell 112 to sense reference node 136. A reference current Ir may thus be drawn through reference cell 112.

Bit bias circuit 132 may maintain sense amplifier input 122 at a predetermined bit bias potential throughout a read operation. As one example, bit bias circuit 132 may maintain sense amplifier input 122 at 1V. Similarly, reference bias circuit 134 may maintain sense reference node 136 at a predetermined reference bias voltage throughout a read operation. As one example, a reference bias circuit 134 may maintain sense reference node 136 at 1V.

If the selected memory cell 102-01 is programmed, it can have a relatively high threshold voltage. Thus, while word line signal W0 is active, memory cell 102-01 can draw essentially no current (0 $\mu$A). Ideally, any leakage introduced by other memory cells on bit line 106-0 is sufficiently small that Im remains less than Ir, and memory cell 102-01 is properly detected as a programmed cell.

However, with bit bias circuit 132 providing a bit bias voltage to sense amplifier input 122 and with transfer gate 120-0 enabled, the bit bias voltage is applied to the drains of deselected memory cells connected to bit line 106-0. As previously described, in the event one or more of the deselected memory cells has an undesirably low threshold voltage, a leakage current may result that contributes to memory cell current Im. If such leakage current results in Im>Ir, memory cell 102-01 will be erroneously read as an erased memory cell.

As noted previously, conventional approaches may not be capable of detecting which of the numerous erased memory cells on a selected bit line is contributing leakage current.

The present invention, however, overcomes this limitation by providing circuits and methods for detecting such low threshold voltage memory cells. This can allow such low threshold voltage memory cells to be written to, raising their threshold voltages to a point where the memory cells no longer contribute substantial leakage current. Such threshold adjusting operations have, in some contexts, been referred to as curing (or "healing" or "repairing") operations.

Next, an operation for detecting low threshold voltage memory cells in the embodiment of FIG. 1 will be described. In a detect operation, the cell check signal CELLCHK is active. Consequently, cell check voltage generating circuit 128 is active.

In a detect operation, power switch control signals PSC-TRL can result in power source switch 124 connecting source line 108 and well line 110 to the cell check voltage generating circuit 128. The cell check voltage generating circuit 128 may provide a detect bias voltage. Such a detect bias voltage may be 0.5V, as one example. Consequently, the sources and wells of memory cells (102-01 to 102-32) can be connected to a detect bias voltage (0.5V, for example).

According to applied signals, such as address signals for example, a memory cell (102-01 to 102-32) can be selected for a detect operation. For example, if memory cell 102-01 is selected, row decoder 116 can activate word line signal W0 on word line 104-0. The remaining word lines signals W1 to Wn can be inactive. More particularly, word line 104-0 can be driven to a select voltage that results in a low threshold voltage memory cell drawing a specified current value, while deselected word lines (104-1 to 104-n) can be driven to 0V.

In addition, column decoder 118 can activate column select signal Y0, enabling transfer gate 120-0. The remaining column select signals Y1 to Yn can be inactive and the remaining transfer gates 120-1 to 120-3 can be disabled. In such a configuration, bit line 106-0 can be connected to sense amplifier input 122 while the remaining bit lines 106-1 to 106-n can be isolated from sense amplifier input 122.

A detect operation can also activate the reference select signal Yref and the reference word line Wref. This can connect the drain of reference cell 112 to sense reference node 136. A reference current Ir may thus be drawn through reference cell 112.

With the cell check signal CELLCHK active, bit bias circuit 132 may maintain sense amplifier input 122 at a predetermined detect bit bias potential throughout the detect operation. This detect bit bias potential may be greater than the bit bias potential of a normal read operation. As but one example, if a normal read operation provides a bit bias potential of 1V at sense amplifier input node 122, in a detect operation, a detect bit bias potential of 1.5V can be provided at sense amplifier input node 122. In one particular arrangement, check voltage generator circuit 128 may provide a potential that is added to a normal bit bias potential to arrive at the larger detect bit bias potential.

In a detect operation, a reference current Ir may be generated in the same general fashion as a normal read operation. That is, a reference bias circuit 134 may maintain sense reference node 136 at the bias voltage throughout the detect operation. More particularly, if a detect input bias potential is 1.5V, the reference bias circuit 134 may maintain sense reference node 136 at 1V.

In a detect operation, if the selected memory cell 102-01 has an erase threshold voltage that is acceptably high (i.e., it is not a low threshold voltage memory cell), the selected memory cell 102-01 can draw essentially no current (0 $\mu$A).

Further, while memory cell 102-01 is being detected, the remaining memory cells on the same bit line (106-0) are being biased so as to prevent other low threshold voltages from drawing any current. In particular, such other memory cells on the same bit line are receiving the detect bias potential on their sources and wells and the word line deselect potential on their control gates. As but one example, such memory cells can have a word line deselect potential of 0V and a source/well potential of 0.5 volts. This introduces a gate-to-source voltage of –0.5V, which can eliminate and/or reduce leakage current from other low threshold voltage memory cells on the same bit line (106-0).

Consequently, if the selected memory cell 102-01 of a detect operation draws essentially no current, little or no additional current will be introduced by deselected cells on the same bit line 106-0. Thus, if Im<Ir, the memory cell 102-01 can be detected as an erased memory cell with a sufficiently high threshold voltage (i.e., it is not a low threshold voltage memory cell).

Conversely, if a detected memory cell 102-01 draws sufficient current so that Im>Ir, it is known that the selected memory cell 102-01 is a low threshold voltage memory cell. In particular, because deselected memory cells on the same bit line are advantageously biased, it is known that the current drawn (Im), is essentially drawn by selected memory cell 102-01, and not by any other additional low voltage memory cells on the same bit line 106-0.

Figure 3A:
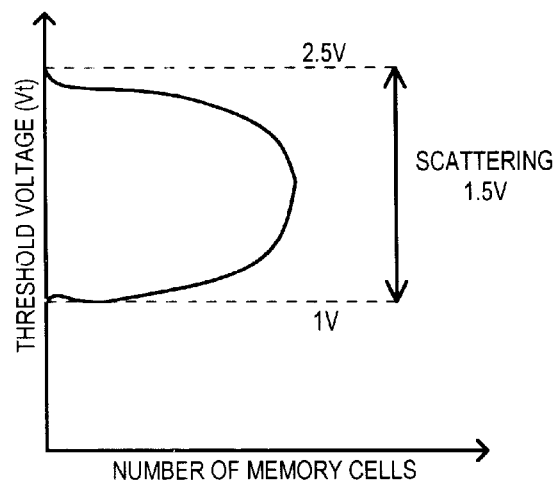
FIG. 3A is a graph illustrating the distribution of erased memory cell threshold voltages in a device having a high supply voltage of 2.5V.
Figure 3B:
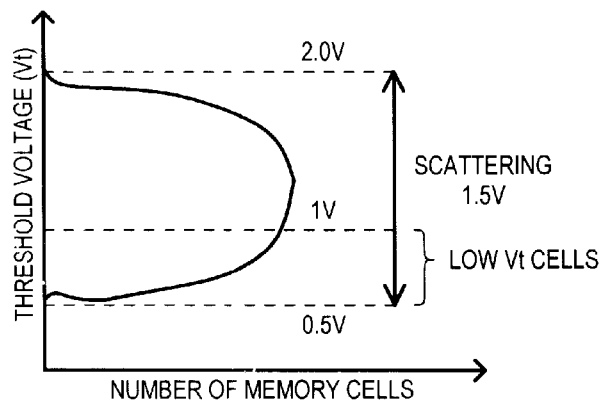
FIG. 3B is a graph illustrating the distribution of erased memory cell threshold voltages in a device having a high supply voltage of 2.0V.

In this way, the embodiment of FIG. 1 can advantageously distinguish those memory cells that have low threshold voltages. Once detected, such low threshold voltage memory cells can be written to in order to raise their threshold voltage to a sufficiently high value. Such an arrangement can allow a non-volatile semiconductor storage device to have a lower operating voltage while maintaining fast sense speeds. As but one example, if reference is made back to FIG. 3B, the present invention may be used to detect those memory cells in the distribution having threshold voltages less than 1V. The threshold voltages of these memory cells may be raised to 1V or greater. This can allow a 2V operating potential without incurring the drawback of conventional approaches. Still further, the approach of the present invention can allow for smaller threshold voltage distributions, allowing for better and/or faster sense margins.

Figure 4:
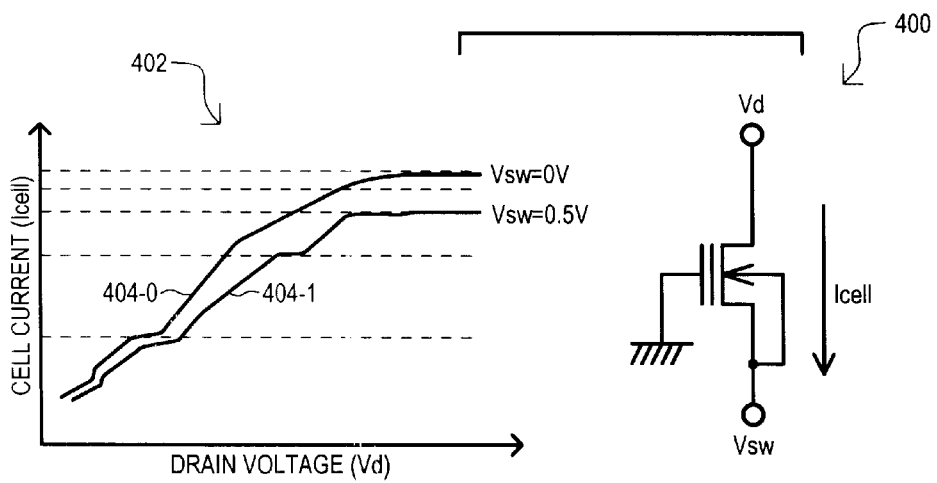
FIG. 4 is a graph illustrating the current drawn by a nonvolatile memory cell according to particular biasing conditions.
Figure 5:
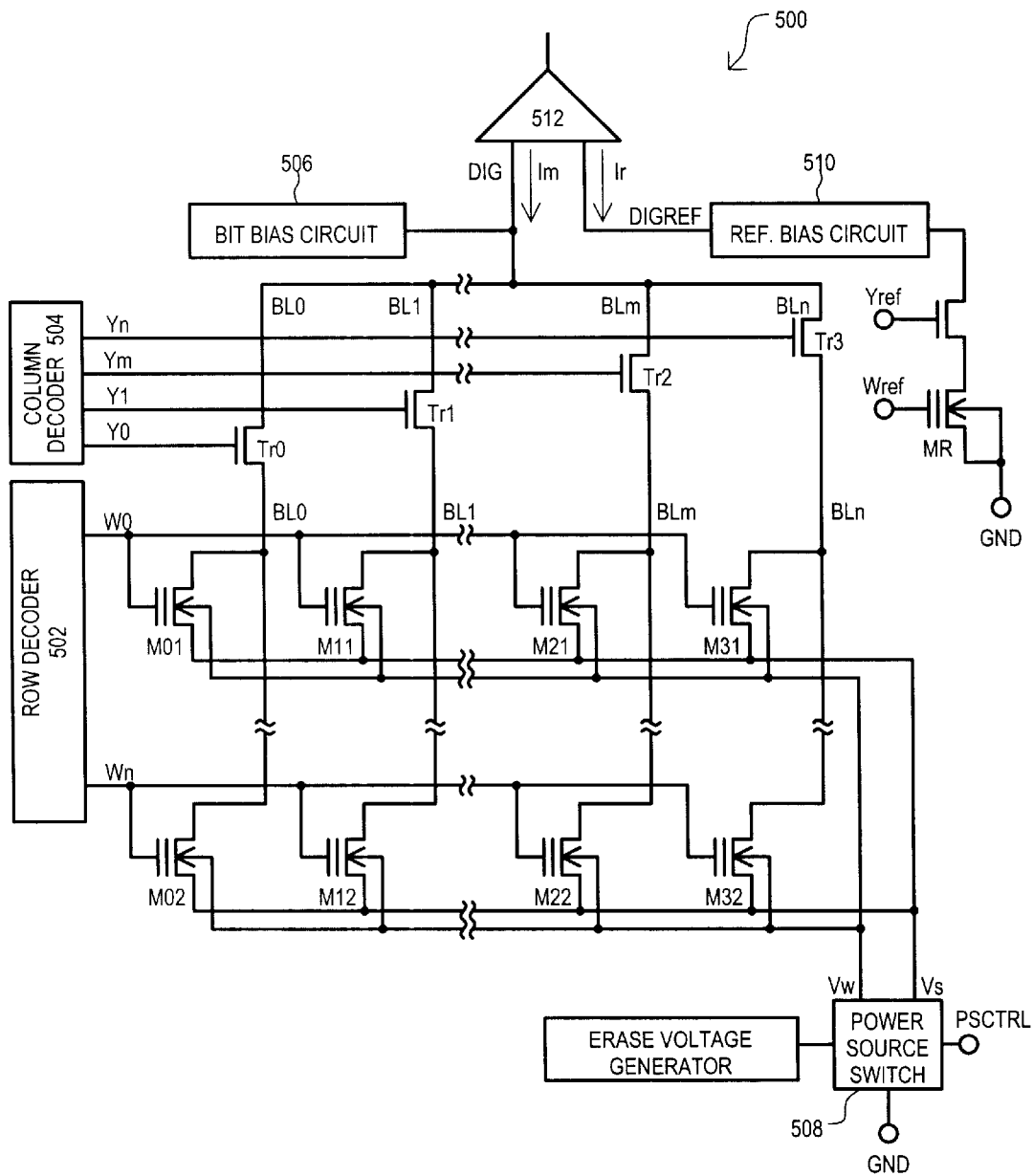
FIG. 5 is circuit diagram of a conventional nonvolatile semiconductor storage device.

FIG. 4 is a graph illustrating the current drawn by a nonvolatile memory cell according to various biasing conditions. More particularly, FIG. 4 shows how a positive bias to a memory cell source and well can reduce the magnitude of the current drawn by the memory cell. A memory cell 400 is shown that has a grounded control gate, a drain that receives a drain voltage Vd, and a source and well that both receive a voltage Vsw. A graph 402 includes two curves. A first curve 404-0 illustrates a response where Vsw is zero volts (grounded). Thus, curve 404-0 can represent a conventionally deselected memory cell. A second curve 404-1 illustrates a response where Vsw is 0.5V. Thus, curve 404-1 can represent a deselected memory cell according to one particular embodiment of the present invention. The curve 404-1 is shown to have smaller current values than the curve 404-0.

It is noted that other conventional approaches have been proposed for detecting low threshold voltage memory cells. Such approaches include maintaining a source and well at a ground potential, and deselecting memory cells with a negative word line potential. Such approaches are not desirable, as they require a negative voltage generator. Such negative voltage generating circuits may require a more complex manufacturing process as well as additional circuitry. Still further, such arrangements can require a more complex row decoder, as such circuits must be capable of handling a negative voltage. Consequently, the added complexity and cost of negative word line deselect approaches can be impractical to implement. In contrast, the present invention can allow for the detection of low erase threshold voltage memory cells without employing a negative word line voltage.

Figure 2:
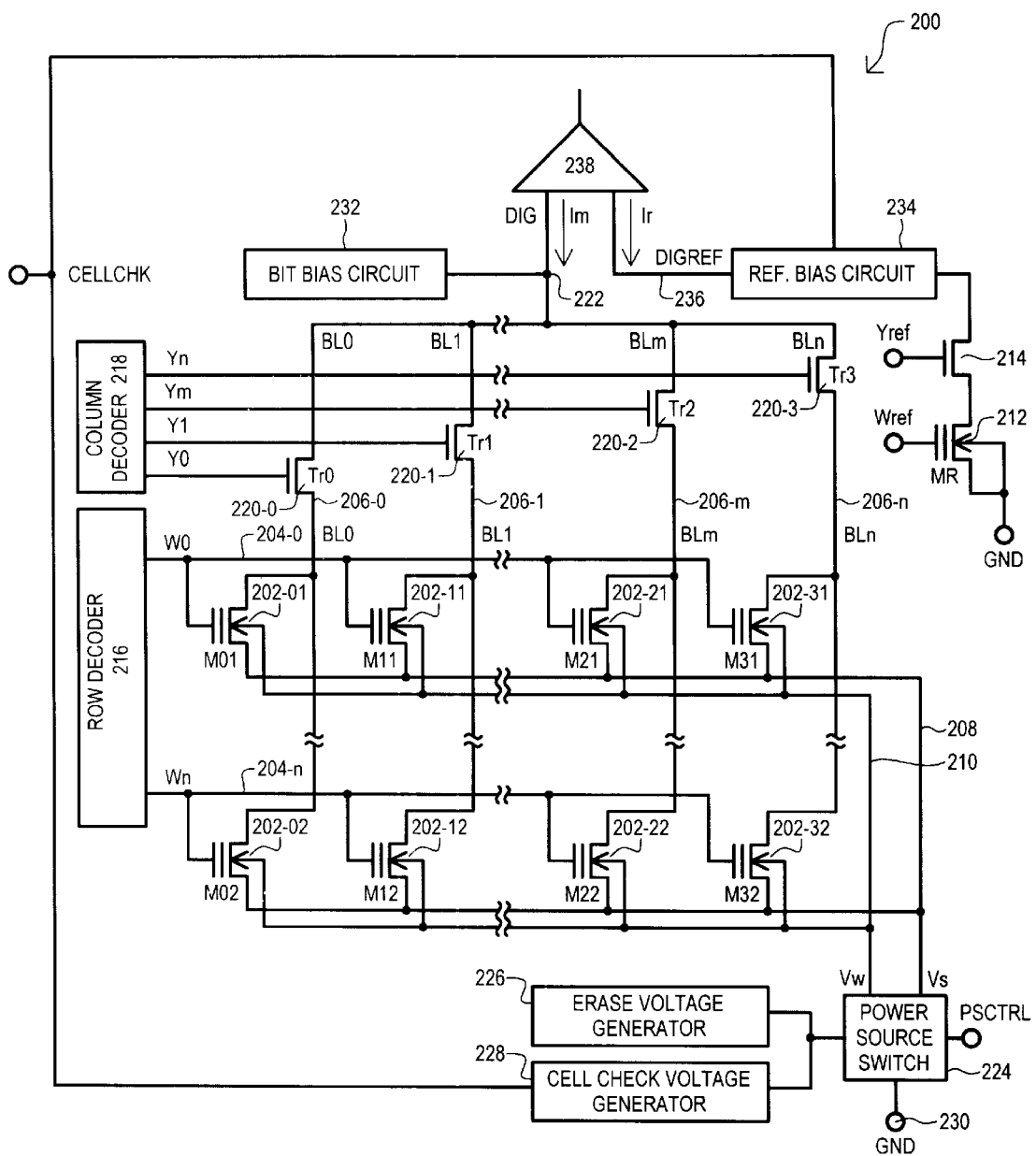
FIG. 2 is a circuit diagram of a second particular embodiment.

Another embodiment will now be described with reference to FIG. 2. FIG. 2 is a nonvolatile semiconductor storage device 200 that includes memory cells 202-01 to 202-32. Memory cells (202-01 to 202-32) can be arranged in a matrix, formed in one or more wells, and each include a control gate, a floating gate, a source, a drain. Memory cells (202-01 to 202-32) may be connected to word lines 204-0 to 204-n at their control gates, to bit lines 206-0 to 206-n at their drains, to a source line 208 at their sources, and to a well line 210 at their well(s).

A reference cell 212 and corresponding reference transfer gate 214 can be activated by a reference word line signal Wref and a reference select signal Yref, respectively.

Word lines (204-0 to 204-n) may be selected by a row decoder 216 that activates word line signals W0 to Wn, and bit lines (206-0 to 206-n) may be selected by a column decoder 218 that can enable a transfer gate 220-0 to 220-3. A selected bit line (206-0 to 206-n) can be connected to a sense amplifier input node 222 by transfer gates (220-0 to 220-3).

A power source switch 224 can connect the various sources and well(s) of memory cells (202-01 to 202-32) to an erase potential, provided by an erase voltage generator circuit 226, to a detect bias potential, provided by a cell check voltage generator circuit 228, or to a low power supply potential (GND), provided by a low power supply voltage 230.

A bit bias circuit 232 can bias sense amplifier input node 222 to a predetermined potential, while a reference bias circuit 234 can bias a sense reference node 236 to various predetermined bias potentials. Sense amplifier input node 222 and sense reference node 236 can be inputs to a sense amplifier 238.

Having described the general constituents of the embodiment of FIG. 2, the operation of FIG. 2 will now be described.

A normal read operation for the embodiment of FIG. 2 can take place in the same general fashion as the embodiment of FIG. 1. A discussion of such an operation is therefore omitted.

An operation for detecting low threshold voltage memory cells in the embodiment of FIG. 2 will now be described. In a detect operation, the cell check signal CELLCHK is active resulting in cell check voltage generating circuit 228 providing a detect bias voltage. Such a detect bias voltage may be 0.5V, for example. In addition, power switch control signals PSCTRL can cause power source switch 224 to connect source line 208 and well line 210 to the detect bias voltage of cell check voltage generating circuit 228. Consequently, the sources and wells of memory cells (202-01 to 202-32) can be biased to the detect bias voltage (0.5V, for example).

A memory cell (202-01 to 202-32) can be selected for a detect operation. For example, if memory cell 202-01 is selected, row decoder 216 can drive word line 204-0 to a detect word line voltage that results in memory cell 202-01 drawing a specified current value if it has a low threshold voltage. At the same time, the remaining deselected word lines (204-1 to 204-n) can be driven to a deselect potential (0V, for example). Further, column decoder 218 can enable transfer gate 220-0 and disable the remaining transfer gates 220-1 to 220-3, connecting bit line 206-0 to sense amplifier input 222.

In a detect operation, reference transfer gate 214 is enabled connecting the drain of reference cell 212 to sense reference node 236. This can result in a reference current Ir being drawn through reference cell 212.

With the cell check signal CELLCHK active, bit bias circuit 232 may maintain sense amplifier input 222 at a predetermined detect bit bias potential throughout the detect operation. This detect bit bias potential may be essentially the same as the bit bias potential of a normal read operation. As but one example, if a normal read operation provides a bit bias potential of 1V at sense amplifier input node 222, in a detect operation, a detect bit bias potential of 1V can be provided at sense amplifier input node 222.

In a detect operation, a reference current Ir may be generated with a detect reference bias potential provided by reference bias circuit 234. In particular, a detect reference bias potential may be less than a reference bias potential utilized in a normal read operation. More particularly, a reference bias circuit 234 may supply a 1V reference bias potential in a normal read operation, but provide a 0.5V detect reference bias potential in a detect operation.

In one particular arrangement, the check voltage generator circuit 228 may provide a potential to reference bias circuit 234 that is subtracted from a normal reference bias potential to arrive at the lower detect reference input bias potential.

In a detect operation, if the selected memory cell 202-01 has an erase threshold voltage that is acceptably high (i.e., it is not a low threshold voltage memory cell), the selected memory cell 202-01 can draw essentially no current (0 μA). Further, as in the case of the first embodiment 100, while memory cell 202-01 is being detected, the remaining memory cells on the same bit line (206-0) are being biased so as to prevent other low threshold voltage memory cells from contributing any substantial leakage current to the current Im sensed by sense amplifier 238.

Thus, if the selected memory cell 202-01 of a detect operation draws essentially no current, little or no additional current will be introduced by deselected cells on the same word line. Therefore, if Im<Ir, the memory cell 202-01 can be detected as an erased memory cell with a sufficiently high threshold voltage (i.e., it is not a low threshold voltage memory cell).

Conversely, if a selected memory cell 202-01 draws sufficient current so that Im>Ir, it is known that the selected memory cell 202-01 is a low threshold voltage memory cell, and the threshold voltage of the memory cell may be subsequently raised.

In this way, the embodiment of FIG. 2, like that of FIG. 1, can advantageously distinguish those memory cells that have low threshold voltages allowing such low threshold voltages to be raised.

Thus, the various described embodiments may provide advantages over conventional nonvolatile semiconductor storage devices. In most conventional approaches, the sources and wells of memory cells are maintained at a low power supply level. In such an arrangement, it may not be possible to detect low threshold voltage memory cells. The various embodiments, however, can detect such memory cells by advantageous biasing of deselected memory cells. In particular, the source and/or wells of the memory cells may be biased to a positive potential while deselected word lines may be maintained at a low power supply voltage. Such an arrangement can result in a negative gate-to-source potential that may reduce and/or eliminate leakage from deselected memory cells.

It is understood that while the various embodiments have described memory cells with particular construction, the present invention is not limited thereto. Other embodiments may include different types of memory cells having adjustable threshold voltages.

It is also understood that while various references have been made to a low power supply potential (GND), such a power supply potential is not necessarily zero volts or the same potential as an externally supplied power supply level. As but one example, a nonvolatile semiconductor storage device may generate one or more internal power supply voltages that are less than or greater than external power supply voltages.

Thus, it is understood that while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor device, comprising:
    a plurality of nonvolatile memory cells that each includes a control terminal, a controllable impedance path having one end coupled to a bit line and another end connected to a source line, the memory cells being formed in at least one well;
    a well line connected to the at least one well; and
    a switch circuit that couples a detect bias voltage to the source line and the well line in a detect operation, the detect operation sensing memory cells having an erase threshold voltage less than a predetermined magnitude, the bias voltage being between a high power supply level and a low power supply level.

2. The semiconductor device of claim 1, wherein:
    the memory cell controllable impedance path includes a source-drain path.

3. The semiconductor device of claim 1, wherein:
    the low power supply level is zero volts and the detect bias voltage is a positive voltage.

4. The semiconductor device of claim 1, wherein:
    the predetermined magnitude is no greater than 1 volt.

5. The semiconductor device of claim 1, further including:
    a cell check signal input that receives a cell check signal; and
    a cell check voltage generator that generates the detect bias voltage when the cell check signal is active.

6. The semiconductor device of claim 1, further including:
    a bit bias circuit that provides a first bit bias voltage to a selected bit line in a read mode for determining the logic value stored in a memory cell, and a second bit bias voltage that is different than the first bit bias voltage to a selected bit line in the detect mode.

7. The semiconductor device of claim 6, wherein:
    the second bit bias voltage is greater than the first bit bias voltage.

8. The semiconductor device of claim 6, further including:
    a cell check signal input that receives a cell check signal; and
    the bit bias circuit provides the second bit bias voltage when the cell check signal is active.

9. The semiconductor device of claim 1, farther including:
    a sense amplifier that includes a reference input node;
    a reference bias circuit that
        provides a first reference bias voltage to the reference input node in a read mode that generates a reference value for determining the logic value stored in a memory cell, and
        provides a second reference bias voltage to the reference input node in a detect mode, the second reference bias voltage being less than the first reference bias voltage.

10. A method of detecting low erase threshold voltage nonvolatile memory cells that include sources and are formed in wells, comprising the steps of:
    applying a detect bias voltage to the sources and wells of erased nonvolatile memory cells that is greater than a potential applied to the source of a selected nonvolatile memory cell in a read operation; and
    comparing the current of a selected nonvolatile memory cell with that of a reference cell.

11. The method of claim 10, further including:
    erasing the memory cells prior to applying the detect bias voltage.

12. The method of claim 10, further including:
    in a detect mode, applying a bit bias potential to the bit line of a selected nonvolatile memory cell that is greater than a bit bias potential that is applied to a bit line of a selected nonvolatile memory cell in a read operation.

13. The method of claim 10, further including:
    in a detect mode, applying a reference bias potential to the reference memory cell that is less than a reference bias potential applied to the reference memory cell in a read operation.

14. The method of claim 10, wherein:
    the step of applying a detect bias voltage further includes applying a deselect voltage to control gates of deselected nonvolatile memory cells that results in a negative control gate-to-source voltage on the deselected nonvolatile memory cells.

15. A nonvolatile semiconductor device having a detect mode for detecting memory cells having an erase threshold voltage less than a predetermined value, comprising:

a plurality of memory cells, each having a control gate, a source, a drain, and being formed in at least one well;

a plurality of bit lines coupled to the drains of the memory cells;

a plurality of word lines coupled to the control gates of the memory cells; and a switch circuit coupled to the drains and sources of the memory cells, the switch circuit providing a low impedance path between a detect bias voltage in a detect mode, the detect bias voltage being less than a high power supply voltage of the nonvolatile semiconductor device.

16. The nonvolatile semiconductor device of claim 15, wherein:

the detect bias voltage has a magnitude less than one volt.

17. The nonvolatile semiconductor device of claim 15, further including:

a plurality of transfer gates that connect a selected bit line to a sense input node; and a bit bias circuit coupled to the sense input node that provides a first bit bias potential to the sense input node in a read mode and a second bit bias potential to the sense input node in a detect mode, the second bit bias potential being greater than the first bit bias potential.

18. The nonvolatile semiconductor device of claim 15, further including:

a reference cell coupled to a reference node; and a reference bias circuit coupled to the reference input node that provides a first reference bias potential to the reference input node in a read mode and a second reference bias potential to the reference input node in a detect mode, the second reference bias potential being less than the first reference bias potential.

19. The nonvolatile semiconductor device of claim 15, wherein:

a memory cell is deselected in a detect mode by driving its corresponding to word line to a potential less than the detect bias voltage.

20. The nonvolatile semiconductor device of claim 15, wherein:

a memory cell is selected in a detect mode by driving its corresponding to word line to a potential greater than the detect bias voltage.

\* \* \* \* \*